United States Patent [19]
True

[11] Patent Number: 5,483,074
[45] Date of Patent: Jan. 9, 1996

[54] FLOOD BEAM ELECTRON GUN

[75] Inventor: Richard B. True, Sunnyvale, Calif.

[73] Assignee: Litton Systems, Inc., Beverly Hills, Calif.

[21] Appl. No.: 371,286

[22] Filed: Jan. 11, 1995

[51] Int. Cl.$^6$ .................................................. H01J 37/063
[52] U.S. Cl. .................................... 250/423 R; 250/492.3
[58] Field of Search ........................... 250/423 R, 492.3; 313/310

[56] References Cited

U.S. PATENT DOCUMENTS

| | | | |
|---|---|---|---|
| 3,351,795 | 11/1967 | Gronlund | 313/310 |
| 3,569,771 | 3/1971 | Pettit et al. | 315/13 |
| 4,845,370 | 7/1989 | Thompson et al. | 250/492.3 |
| 5,319,211 | 6/1994 | Matthews et al. | 250/492.3 |

Primary Examiner—Jack I. Berman

[57] ABSTRACT

A flood beam electron gun is provided for use in remediation of hazardous volatile organic compounds (VOC) contained within a detoxification vessel. The flood beam electron gun comprises an electron emitter having a rounded emitting surface providing a conical electron beam. A control grid is spaced from and disposed substantially parallel to the emitting surface. The control grid has a plurality of holes disposed in a first pattern providing an array of individual electron beams from the conical electron beam of the emitter. An intermediate electrode is spaced from the emitter and the control grid, and has an aperture therethrough providing a substantially parallel flow of the array of individual electron beams. A target grid is spaced from the intermediate electrode and opposite from the cathode and control grid. The target grid has a plurality of holes disposed in a second pattern that is proportional to and substantially larger than the first pattern. Each of the individual electron beams pass through respective ones of the plurality of holes in registration thereof. A vacuum barrier is provided on a downstream side of the target grid to separate the electron gun from the vessel. The individual electron beams pass through the vacuum barrier into the vessel. Within the vessel, the electrons of the individual beams impact the VOCs, converting the VOCs to less hazardous organic compounds.

21 Claims, 6 Drawing Sheets

FLOOD BEAM ELECTRON GUN

BACKGROUND OF THE INVENTION

1. Field of the Invention

The present invention relates to the use of a high energy electron beam to chemically transform or destroy certain types of hazardous waste, and more particularly, to a flood beam electron gun that efficiently generates a source for the high energy electron beam.

2. Description of Related Art

Volatile organic compounds (VOCs) exist in the form of gasses that are emitted or vaporized from hazardous or toxic waste materials. Since these VOCs pose a significant health risk to individuals and to the environment, it is necessary to contain, extract and collect the hazardous materials so as to prevent spreading of the VOCs into the air and/or ground water. Once contained, the VOCs can be remediated by converting them into less hazardous materials that can be disposed of with substantially reduced risk.

One such remediation technique involves the injection of a high energy electron beam into a detoxification vessel containing the VOCs. Interaction between the electrons of the beam and the VOCs causes chemical transformation of the VOCs in three significant aspects, including: (1) direct de-chlorination resulting in inorganic chloride ions and reactive organic intermediates which are further degraded into non-reactive compounds; (2) production of organic and inorganic free radicals and ions which are reactive and whose reactions result in destruction of the target hazardous materials; and (3) formation of aqueous electrons (in the presence of water vapor) capable of reducing chemical bonds. An example of a toxic remediation device comprising an electron emitting source coupled to a detoxification vessel is disclosed in U.S. Pat. No. 5,319,211.

In order to achieve a sufficient level of remediation within the detoxification vessel, it is desirable to provide an electron beam having relatively high energy (such as 220 kilovolts or higher). Within the microwave tube art, electron guns are known to provide a high voltage, pencil-shaped electron beam. Such conventional pencil-shaped electron beams are undesirable electron sources in this application, since the highly focused beams tend to concentrate all their energy into a relatively small region of the vessel. As a result, only a portion of the electrons of the concentrated beam ultimately interacts with the VOCs, with the remainder being dissipated into the vessel walls in the form of thermal loss. In addition, the electron gun operates in a vacuum environment, and the electrons of the beam must pass through a vacuum barrier to the non-vacuum environment within the detoxification vessel. Conventional vacuum barriers do not permit electrons to transmit therethrough without significant additional energy loss to the barrier structure.

Thus, a critical need exists for a high voltage electron gun for use with a detoxification vessel for remediation of VOCs from hazardous or toxic waste. Such an electron gun should be capable of efficiently conducting a relatively broad electron beam into the vessel without undesired energy loss.

SUMMARY OF THE INVENTION

In accordance with the teachings of this invention, a flood beam electron gun is provided for use in remediation of hazardous VOCs disposed within a vessel. The flood beam electron gun provides a broad array of individual, parallel, and pencil-shaped beams. The parallel nature of the individual beams enables the electrons of the beams to pass efficiently through a vacuum barrier into the VOC vessel without undesired energy loss to the vacuum barrier or its associated support structure.

In particular, the flood beam electron gun comprises an electron emitter having a rounded emitting surface providing a conical electron beam. A control grid is spaced from and disposed substantially concentric with the emitting surface. The control grid has a plurality of holes comprising a first pattern providing an array of individual electron beams from the conical electron beam of the emitting surface. An intermediate electrode is spaced from the emitter and the control grid, and has an aperture therethrough providing a substantially parallel flow of the array of individual electron beams. A target grid is spaced from the intermediate electrode and is opposite from the emitter and control grid. The target grid has a plurality of holes comprising a second pattern that is proportional to and substantially larger than the first pattern. Each of the individual electron beams pass through respective ones of the plurality of holes in registration thereof. A vacuum barrier is provided on a downstream side of the target grid to separate the electron gun from the vessel. The individual electron beams pass through the vacuum barrier into the vessel with minimal energy loss to the target grid or the vacuum barrier.

A more complete understanding of the flood beam electron gun will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention satisfies the critical need for a high voltage electron gun for use with a detoxification vessel for remediation of VOCs from hazardous or toxic waste. The electron gun is capable of efficiently conducting a relatively broad electron beam into the vessel without undesired energy loss.

Figure 1:
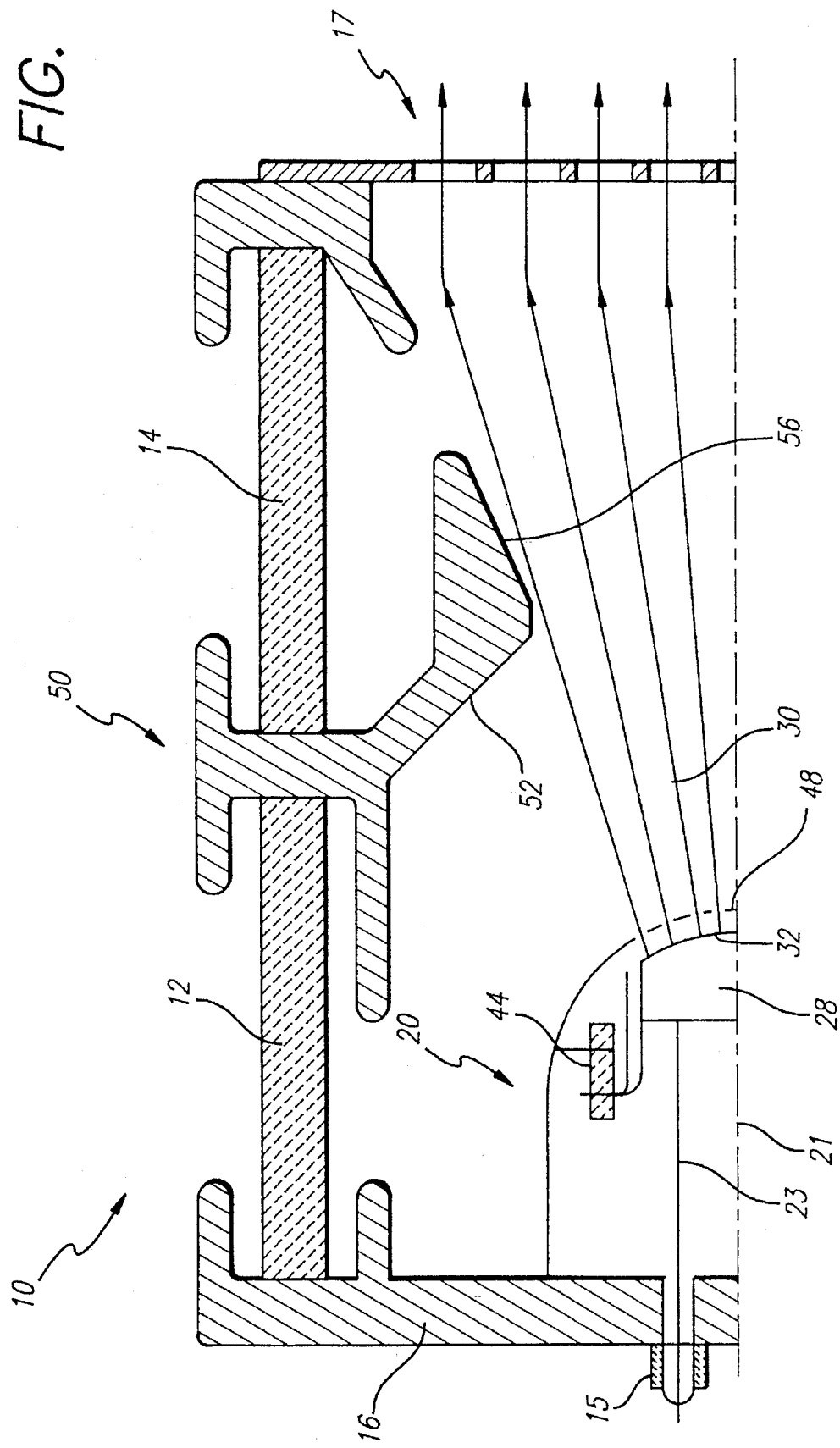
FIG. 1 is a schematic view of a flood beam election gun of the present invention.

Referring first to FIG. 1, a schematic view of a flood beam electron gun 10 is illustrated. The electron gun 10 has a generally cylindrical shape, and is contained within two cylindrical housing segments 12, 14. Each of the housing segments 12, 14 are comprised of an electrically insulative and thermally conductive material, such as ceramic. An end of the electron gun 10 is enclosed by an end plate 16 that includes a plurality of electrically insulated feedthroughs 15 which provide for electrical connection to the electron gun, as will be described below. An opposite end of the electron gun is enclosed by a target grid 17, that is in turn coupled to the detoxification vessel (not shown).

An emitter structure 20 extends inwardly of the housing segment 12 along a central axis 21 of the electron gun 10. The emitter structure 20 includes an electron emitting element 28 having a rounded or generally spherical emitting surface 32. The electron emitting element 28 is physically suspended within the emitter structure 20, and electrically insulated from the emitter structure, by use of an electrically insulated support ring 44. A conical shaped beam of electrons 30 is emitted from the emitting surface 32 by thermionic emission in cooperation with a high voltage electric field defined between the emitting surface 32 and the target grid 17. An emitter lead 23 is electrically connected to an electrical heater embedded below the emitting surface 32, and extends outwardly through the electrical feedthrough 15 to an external voltage source. Additional leads are also included (not shown) to electrically connect the emitting element 28 to an external bias voltage through another electrical feedthrough.

A grid 48 generally matching the curvature of the emitting surface 32 can be included in front of the emitting surface to control the current level of the electron beam 30 that is emitted. The grid 48 is provided with a voltage positive or negative with respect to the voltage of the emitting surface 32 to accomplish this modification in the level of the emitted current.

An intermediate electrode 50 is disposed between the housing segments 12, 14, and is provided with a voltage between that provided to the cathode emitting surface 32 and the target grid 17. The intermediate electrode 50 has a first funnel-shaped inner surface 52 facing the emitting surface 32, and a second funnelshaped inner surface 56 facing the target grid 17. The inner surfaces 52, 56 shape the electric field within the electron gun 10 to provide a converging lens for the beam 30. As a result, the conical shaped beam 30 is converged into a parallel-directed beam. The parallel-directed beam can then be coupled through the target grid 17 and into the detoxification vessel perpendicularly to minimize energy loss, as will be further described below.

Figure 2:
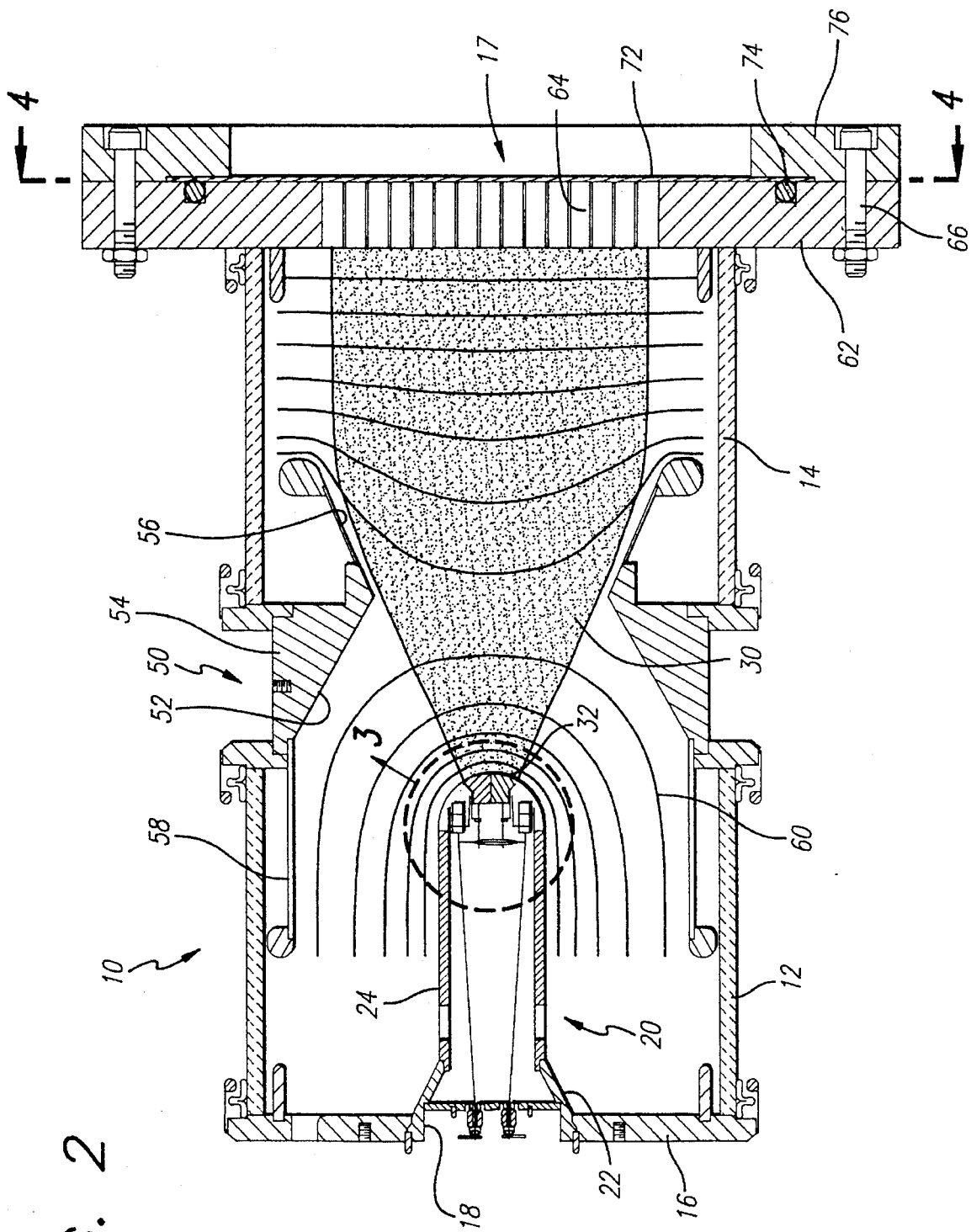
FIG. 2 is a side sectional view of an embodiment of the flood beam electron gun.
Figure 3:
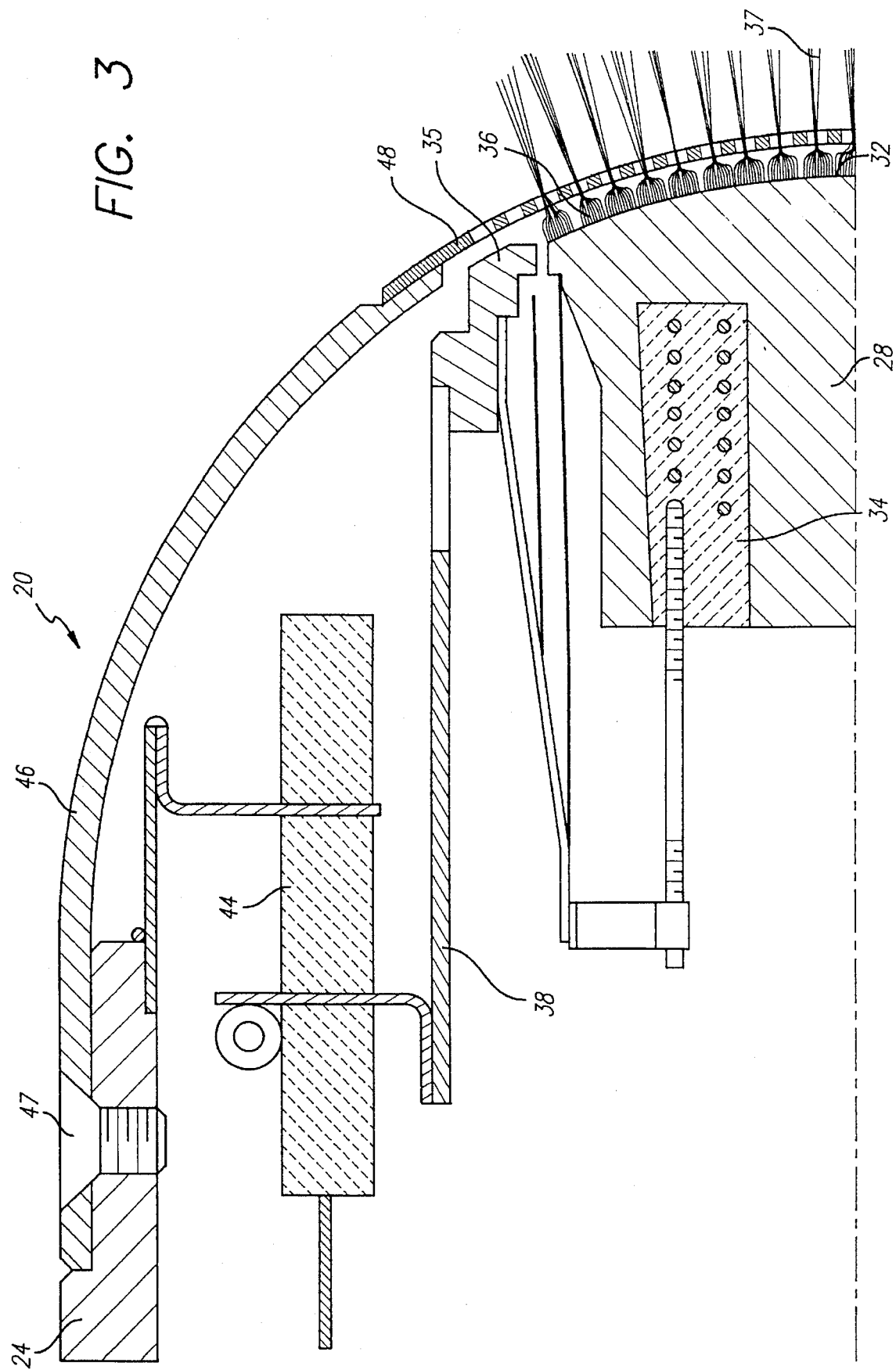
FIG. 3 is an enlarged side sectional view of an emitter of the flood beam electron gun of FIG. 2.

Referring now to FIGS. 2 and 3, a first embodiment of the flood beam electron gun 10 is illustrated, with like numerals utilized to describe like elements of FIG. 1. As illustrated in FIG. 2, the emitter structure 20 extends inwardly relative to the housing segment 12 through a central aperture 18 provided in the end plate 16. The emitter structure 20 comprises a tapered end support 22 and a sleeve 24. Each of these elements 22, 24 are physically and electrically coupled together and are comprised of an electrically and thermally conductive material, such as copper or molybdenum.

FIG. 3 illustrates the emitter structure 20 of FIGS. 1 and 2 in greater detail. As in FIG. 1, the emitter structure 20 has a central electron emitting element 28 having a rounded emitting surface 32. A heater element 34 comprising a heating coil potted within an alumina ceramic substructure is embedded within the electron emitting element 28. As known in the art, an electrical current applied to the heater element 34 raises the temperature of the electron emitting element 28 until thermionic emission of electrons from the emitting surface 32 occurs. The electron emitting element 28 is suspended within the emitter structure 20 by a support cylinder 38. An end of the support cylinder 38 adjacent to and circumscribing the emitting surface 32 provides a focusing electrode 35. As known in the art, the focusing electrode 35 contributes to shaping of the electric field, and may have a voltage potential applied thereto that is equivalent to the potential at the emitting surface 32. An insulating ring 44 is coupled between the support cylinder 38 and the sleeve 24. The insulating ring 44 is comprised of an electrically insulating and thermally conductive material, such as alumina ceramic, and precludes electrical connection between the sleeve 24 and the emitting element 28.

The emitter structure 20 further includes a generally domeshaped grid support 46 and a centrally disposed control grid 48. The grid support 46 is comprised of an electrically conductive material, such as molybdenum, and is physically and electrically connected to the sleeve 24, such as by screws 47. The control grid 48 is concentrically aligned with the cathode emitting surface 32 so the emitting surface and control grid are substantially parallel. The control grid 48 has a plurality of holes arranged in a particular pattern, which will be described in further detail below with respect to the target grid. The control grid 48 is unitarily comprised of an electrically conductive, thermally rugged material, such as molybdenum or copper zirconium. Alternatively, the control grid 48 may be comprised of a fine mesh having a plurality of round, square or hexagonal-shaped holes from like materials. It is anticipated that the entire emitter structure 20 including the control grid 48 be removable from the electron gun 10 for ease of repair and/or maintenance.

Referring back to FIG. 2, the flood beam electron gun 10 further includes an intermediate electrode 50. The intermediate electrode 50 comprises a solid body portion 54, a cylindrical portion 58, a first inner surface 52, and a second inner surface 56. The solid body portion 54 is generally ring-shaped, and is comprised of an electrically and thermally conductive material, such as copper. The cylindrical portion 58 extends from the body portion 54 in the direction of the end plate 16, and is concentric with the cylindrical housing segment 12. The first inner surface 52 faces the cathode emitting surface 32 and is funnel-shaped with a taper converging in the direction of the target grid 17. The second inner surface 56 faces downstream from the emitting surface 32 and is funnel-shaped with a taper converging in the direction of the emitting surface. The space defined radially inward from the first and second inner surfaces 52, 56 provides an aperture through which the electron beam 30 passes.

The target grid 17 is coupled to the housing segment 14 at an opposite end of the electron gun 10 from the end plate 16. The target grid 17 comprises a broad flange portion 62 that permits attachment of the electron gun 10 to the detoxification vessel, and is comprised of an electrically and thermally conductive, mechanically rigid material, such as stainless steel or molybdenum or a laminate structure comprising one or more of these materials enclosing a copper sheet for higher effective heat transfer. One or more bolts 66 may be included to secure the flange portion 62 to the detoxification vessel. An intermediate flange 76 may also be utilized, which is disposed between the flange portion 62 and the detoxification vessel as illustrated in FIG. 2. The intermediate flange 76 may be secured to the flange portion 62 by the bolts 66, and contributes to formation of a vacuum seal, as will be further described below.

Figure 4:
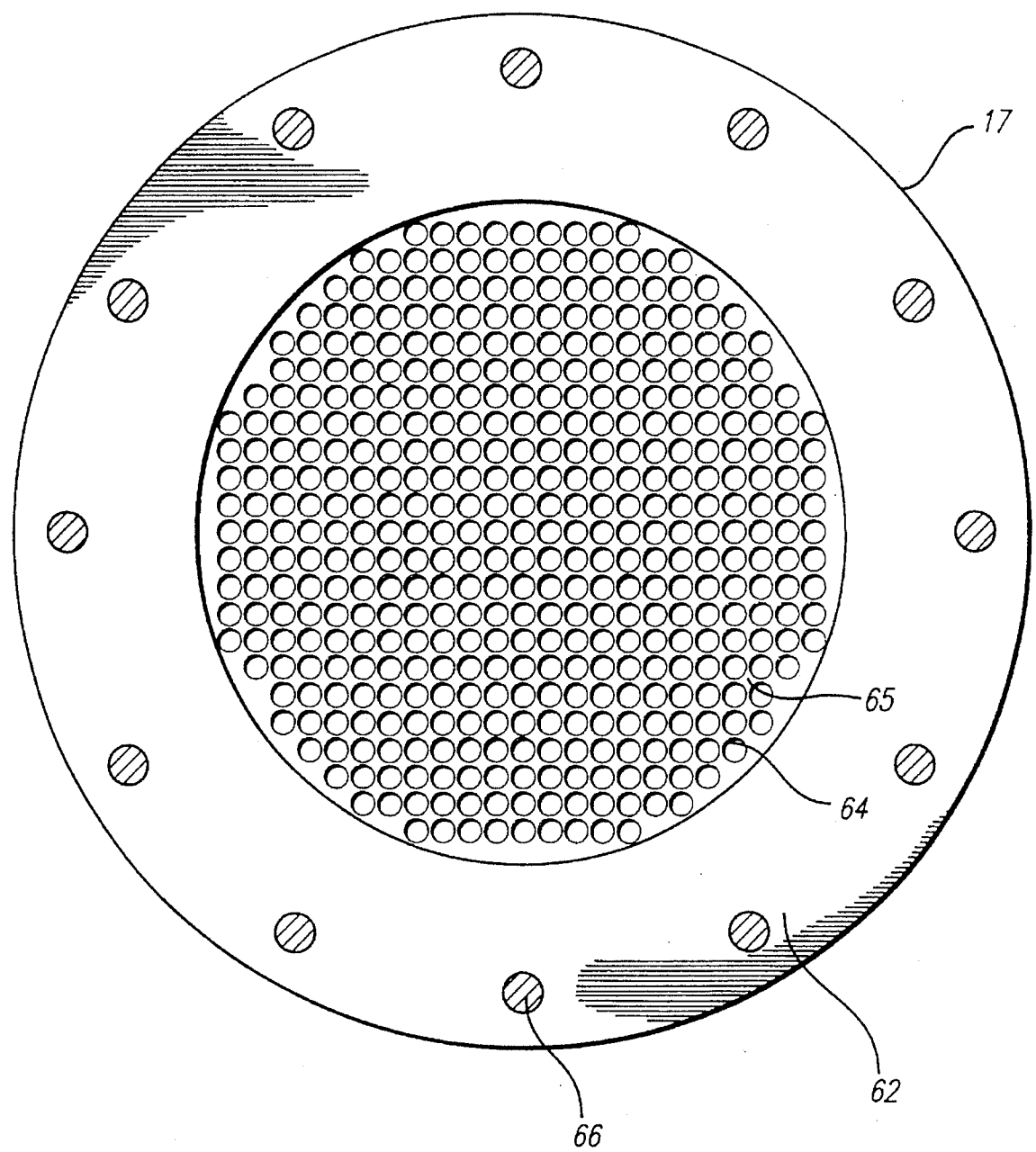
FIG. 4 is an end view of the flood beam electron gun illustrating a target grid having a beam array pattern, as taken through the section 4—4 of FIG. 2.

A plurality of holes 64 are provided through the target grid 17 in an axial direction thereof, as also illustrated in FIG. 4. The holes 64 are disposed in a pattern that is proportional to and larger than the pattern of holes in the control grid 48. The holes 64 may be circular of a substantially uniform diameter, or may instead comprise differing diameters from the central portion of the grid to the outer periphery.

A vacuum barrier 72 is coupled to a downstream side of the target grid 17. The vacuum barrier 72 comprises a thin metal foil, such as titanium or beryllium, and provides a vacuum seal for the electron gun 10. An O-ring seal 74 is disposed in a channel defined in the side of the target grid 17 which compresses between the vacuum barrier 72 and the intermediate flange 76. The O-ring 74 may be comprised of metal to promote a solid bond with the foil vacuum barrier 72, and may also be plated with gold material. The intermediate flange 76 is disposed at an opposite side of the vacuum barrier 72 from the O-ring 74. The vacuum barrier 72 is secured in place between the intermediate flange 76 and the target grid 17 by use of the bolts 66. Alternatively, the vacuum barrier 72 may be brazed to the target grid 17 in order to seal the vacuum.

Further, a thin, finer mesh grid may be brazed or otherwise affixed to the upstream side of the target grid 17 for additional thermal and mechanical support of the vacuum barrier 72. This optional fine mesh grid has a substantially smaller hole pattern than the target grid 17, and it can be fabricated from molybdenum or copper zirconium by a known process, such as photoetching or electrical discharge machining. For mechanical strength and high grid transmissivity, square holes in this fine mesh grid are advantageous, although round holes tend to have a higher degree of resistance to foil tearing.

The target grid 17 and vacuum barrier 72 are preferably circular in shape, as illustrated in FIG. 4, in order to evenly distribute stress forces on the foil vacuum barrier. Alternatively, the target grid 17 and vacuum barrier 72 may have a rectangular shape that would be more conducive to heat removal, since a heat exchanger or thermal couple could be attached to a side of the target grid in relatively close proximity to the holes 64. Further, it is possible to arrange the hole pattern in the control grid 48 and the target grid 17 to allow liquid cooling channels to progress across a surface of the target grid for additional cooling. In this case and in all cases above, it is assumed that the control and target grids are in azimuthal alignment with one another and that stray magnetic fields which may cause beam rotation are entirely negligible.

The electron beam produced by the electron gun 10 is controlled and focused by an electric field defined within the electron gun by voltages applied to the emitting element 28, the control grid 48, and the intermediate electrode 50. The target grid 17 is coupled to ground, and the absolute voltages applied to the emitting element 28, the control grid 48 and the intermediate electrode 50 are thus referenced accordingly. The electric field within the electron gun 10 is illustrated in terms of voltage equipotential lines 60. As known in the art, electrons of an electron beam tend to travel in a direction normal to the equipotential lines, and beam focusing is achieved by controlling the shape of the equipotential lines.

In particular, the application of a highly negative potential to the electron emitting element 28 from a voltage source, such as in a range between approximately −160 kilovolts and −220 kilovolts, causes electrons that have been thermionically ejected from the emitting surface 32 to flow in an evenly distributed, conicalshaped beam 36. Application of a small negative potential to the control grid 48 with respect to the emitting surface 32, such as approximately −25 volts, causes the evenly distributed beam 36 to be separated into a beam array comprising a plurality of individual, spherically-directed beams 37. Since a negative potential is applied to the control grid 48 with respect to the emitting surface 32, the control grid draws no current from the emitting surface, and as a result, the control grid dissipates no power. Further, the control grid 48 reduces the field gradient level at the cathode emitting surface 32 so as to reduce the beam current to a level which would not melt the target grid 17 and/or the vacuum barrier foil 72.

An intermediate negative voltage potential is applied to the intermediate electrode 50, such as in a range between approximately −120 kilovolts and −165 kilovolts with respect to ground potential. The intermediate electrode 50 operates as a converging lens to change the spherical flow of the electron beam to a parallel flow. Moreover, the intermediate electrode 50 substantially reduces electric field gradient levels at the control grid 48 and emitter structure 20, allowing the electron gun 10 to operate at higher voltage levels. The voltage level applied to the intermediate electrode 50 can be varied to change the diameter of the electron beam at the plane of the target grid 17.

The electrons of the parallel directed beam pass through the holes 64 of the target grid 17 and the vacuum barrier 72 into the detoxification vessel. Since the hole pattern on the target grid 17 match the pattern on the control grid 48, the individual beams pass through the target grid holes 64 without interception by the walls of the holes. By utilizing a thin foil material for the vacuum barrier 72, energy loss of the electrons to the vacuum barrier is minimized. For example, a titanium vacuum barrier thickness of approximately 0.0006 inches would result in loss of roughly 13 kilovolts, which would allow a sufficiently high energy level to remain in the beam. The thickness of the vacuum barrier 72 can be varied to achieve other desired characteristics of the electron gun; for example, a thicker foil would be more thermally rugged and better able to withstand mechanical stress, while alternatively, a thinner foil would allow greater transfer of electrons through the vacuum barrier.

Figure 5:
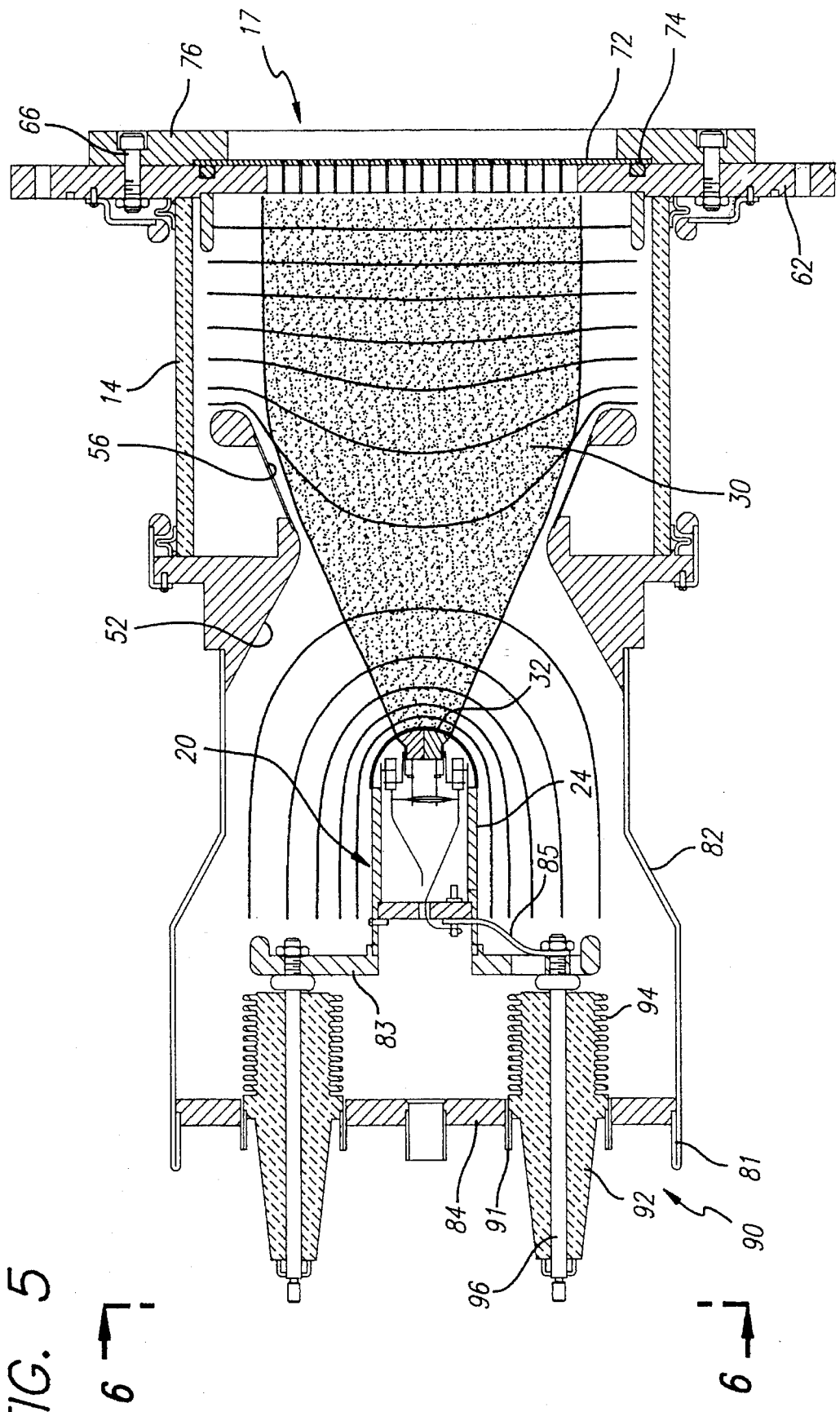
FIG. 5 is a side sectional view of an alternative embodiment of the flood beam electron gun.
Figure 6:
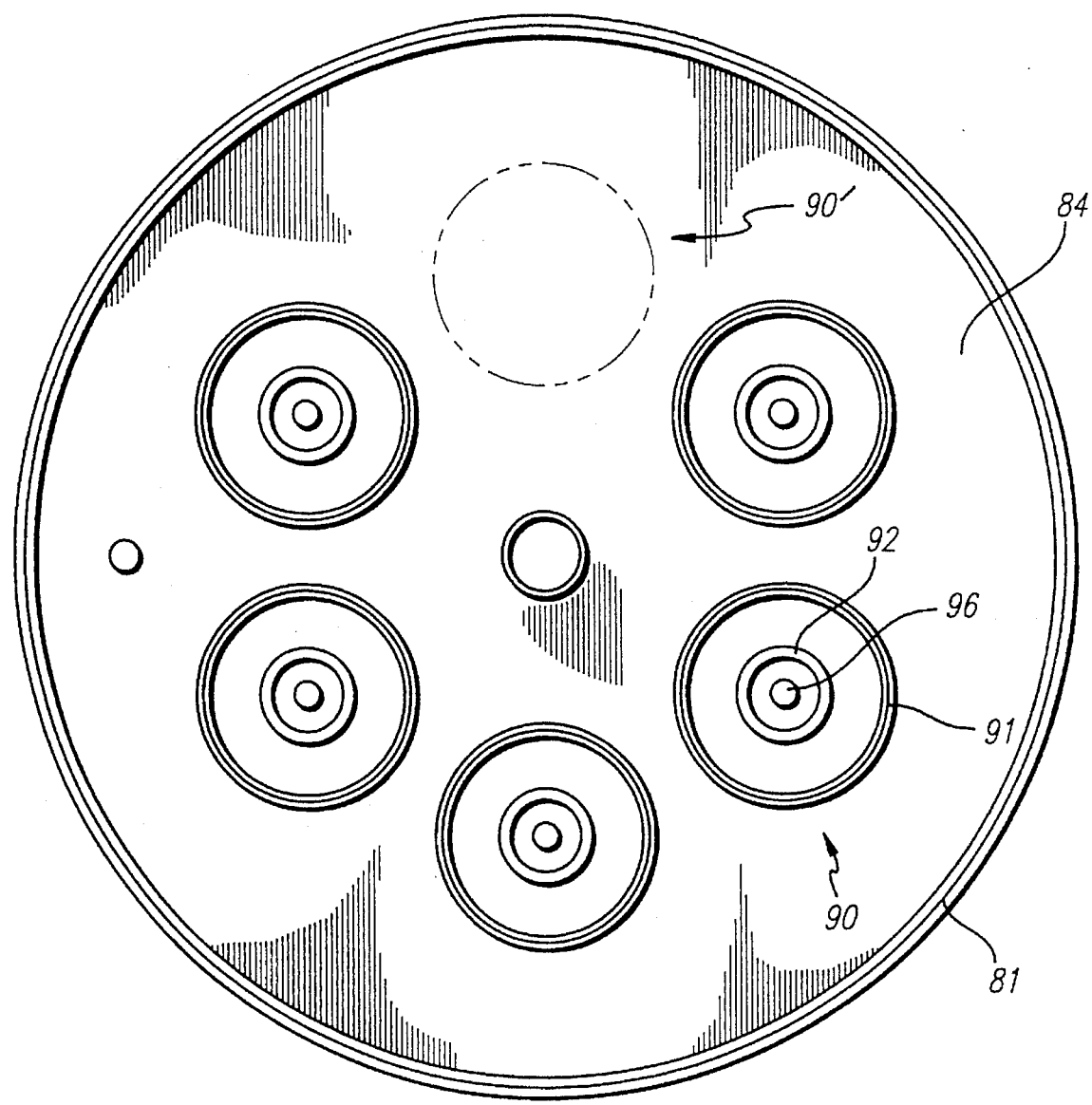
FIG. 6 is an end view of the flood beam electron gun of FIG. 5 illustrating the arrangement of high voltage standoff insulators.

Referring now to FIGS. 5 and 6, an alternative embodiment of the flood beam electron gun is illustrated, with like numerals used to describe like elements of the flood beam electron gun of Figs. 1–4. The alternative embodiment of the flood beam electron gun differs from the previously disclosed embodiment with respect to the mounting of the emitter structure 20. The sleeve 24 of the emitter structure 20 is coupled to a disk-shaped plate 83 that is suspended within the electron gun chamber by three standoff assemblies 90 oriented substantially 120° apart for mechanical support the plate 83. Each of the standoff assemblies 90 are comprised of a thermally conductive and electrically insulative material, such as alumina ceramic. The standoff assemblies 90 further may include one or a plurality of corrugations 94 that increase the outer surface area of the standoff assemblies so as to enable higher voltage standoff. A cone-shaped portion 92 of the standoff assemblies extend outwardly through apertures 91 defined in an end plate 84 of the electron gun.

The standoff assemblies 90 may further include an electrical conductor 96 that extends axially through each standoff assembly thereof. The electrical conductor 96 enables electrical connection to the emitter structure 20 and control grid 48, from external to the vacuum region of the electron gun. In FIG. 5, the electrical conductor 96 couples to a lead 85 that is electrically connected to the heater element 34. Similarly, another one of the standoff assemblies 90 may carry an electrical conductor for connection to the emitting element 28 via the focusing electrode 35. FIG. 6 illustrates five such standoff assemblies 90, with a space provided for an additional standoff assembly 90'. The additional standoff assembly 90' may enable the addition of another electrical element to the emitter structure 20, such as a secondary control grid.

The rearward portion of the electron gun is defined within a housing 82 that extends between a first end 81 that terminates at the end plate 84 and a second end 87 that couples to the intermediate electrode 50. The housing 82 is comprised of an electrically conductive material, such as stainless steel or kovar, that is electrically connected to the intermediate electrode 50. The housing 82 provides the function of the cylindrical portion 58 of FIG. 2, in shaping the electric field defined between the emitting surface 32 and the target grid 17.

The flood beam gun 10 disclosed herein possesses a grid 48 making the device useful for applications that require bursts of free electrons. In operation, the grid 48 can be used to rapidly switch the beam current on and off by biasing it from its normal operating potential to a level sufficiently negative with respect to the emitting element 28 to suppress all emission from the emitting surface 32. Further, by operating the grid 48 at a potential which is more positive than the level cited heretofore, substantially more beam current can be drawn from the emitting surface 32. Thus, the use of the grid 48 as a beam control and modulation element enables operation of the device at high impulse current levels in concurrence with reduced pulse width or duty cycle (to prevent overheating of the output grid and vacuum barrier). Such operation can be used for pulsed electronic bombardment of materials including semiconductors, the creation of plasmas as above, or excitation of gases in certain lasers such as eximer. Similarly, by shaping the openings in the target grid 17 and including additional cooling channels within it as discussed heretofore, and modifying the thickness and material of the vacuum barrier 72, it is possible for the flood beam gun 10 to function as a wide area high power x-ray source.

Having thus described a preferred embodiment of a flood beam electron gun, it should be apparent to those skilled in the art that certain advantages of the within system have been achieved. It should also be appreciated that various modifications, adaptations, and alternative embodiments thereof may be made within the scope and spirit of the present invention. The invention is further defined by the following claims.

What is claimed is:

1. A flood beam electron gun comprising:
   an electron emitter having a rounded emitting surface providing a substantially conical electron beam;
   a control grid spaced from and disposed substantially parallel to said emitting surface, said control grid having a plurality of holes disposed in a first pattern providing an array of individual electron beams from said conical electron beam of said cathode;
   an intermediate electrode spaced from said cathode and said control grid, said intermediate electrode having an aperture therethrough providing a substantially parallel flow of said array of individual electron beams;
   a target grid spaced from said intermediate electrode and opposite from said emitter and control grid, said target grid having a plurality of holes disposed in a second pattern that is proportional to and substantially larger than said first pattern, each of said individual electron beams passing through respective ones of said plurality of holes in registration thereof; and
   a vacuum barrier provided on a downstream side of said target grid, said individual electron beams passing through said vacuum barrier.

2. The flood beam electron gun of claim 1, wherein said vacuum barrier is comprised of metal foil.

3. The flood beam electron gun of claim 2, wherein said vacuum barrier is further comprised of titanium.

4. The flood beam electron gun of claim 1, further comprising an O-ring seal disposed between said target grid and said vacuum barrier.

5. The flood beam electron gun of claim 1, wherein said target grid and said vacuum barrier each have a substantially circular shape.

6. The flood beam electron gun of claim 1, wherein said target grid and said vacuum barrier each have a substantially rectangular shape.

7. The flood beam electron gun of claim 1, further comprising means for applying a voltage at a first potential to said emitting surface, said cathode providing said conical electron beam in response to said voltage.

8. The flood beam electron gun of claim 7, further comprising means for applying a voltage at a second potential to said control grid, said second potential being negative with respect to said first potential.

9. The flood beam electron gun of claim 8, further comprising means for applying a voltage at a third potential to said intermediate electrode, said third potential being positive with respect to said first potential and said second potential.

10. A flood beam electron gun, comprising:
    means for emitting a plurality of conically diverging electron beams in a first pattern;
    means for diverting said plurality of conically diverging electron beams to provide a parallel flow of said electron beams;
    a target grid spaced from said diverting means and having a plurality of holes disposed in a second pattern proportional to and substantially larger than said first pattern; and
    a vacuum barrier provided on a downstream side of said target grid, each of said electron beams passing through respective ones of said plurality of holes and said vacuum barrier in registration thereof.

11. The flood beam electron gun of claim 10, wherein said emitting means further comprises an electron emitting surface, and a control grid spaced from and disposed substantially parallel to said emitting surface, said control grid having a plurality of holes disposed in said first pattern.

12. The flood beam electron gun of claim 11, wherein said emitting surface further comprises a substantially rounded shape.

13. The flood beam electron gun of claim 10, wherein said diverting means further comprises an intermediate electrode spaced from said cathode and said control grid, said intermediate electrode having an aperture therethrough.

14. The flood beam electron gun of claim 10, further comprising means for applying a voltage at a first potential to said emitting surface, said emitting surface providing said conically diverging electron beam in response to said voltage.

15. The flood beam electron gun of claim 14, further comprising means for applying a voltage at a second potential to said control grid, said second potential being negative with respect to said first potential.

16. The flood beam electron gun of claim 15, further comprising means for applying a voltage at a third potential to said intermediate electrode, said third potential being positive with respect to said first potential and said second potential.

17. The flood beam electron gun of claim 10, wherein said vacuum barrier is comprised of foil.

18. The flood beam electron gun of claim 10, wherein said vacuum barrier is comprised of titanium.

19. The flood beam electron gun of claim 10, further comprising an O-ring seal disposed between said target grid and said vacuum barrier.

20. The flood beam electron gun of claim 10, wherein said target grid and said vacuum barrier each have a substantially circular shape.

21. The flood beam electron gun of claim 10, wherein said target grid and said vacuum barrier each have a substantially rectangular shape.

\* \* \* \* \*